United States Patent
Buskmiller et al.

(10) Patent No.: US 6,252,180 B1
(45) Date of Patent: Jun. 26, 2001

(54) ELECTROMAGNETIC INTERFERENCE COVER FOR A CONDUIT AND AN ELECTRONIC EQUIPMENT CHASSIS EMPLOYING THE SAME

(75) Inventors: Michael R. Buskmiller, Dallas; Vincent M. Byrne, Mesquite; Edward C. Fontana, Rockwall; Yehoshua Mandelcorn, Dallas, all of TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/370,531

(22) Filed: Aug. 9, 1999

(51) Int. Cl.[7] ....................................................... H05K 9/00
(52) U.S. Cl. .................................. 174/356 GC; 361/818
(58) Field of Search ............................. 174/35 GC, 35 R, 174/35 TS; 361/816, 818

(56) References Cited

U.S. PATENT DOCUMENTS 5,175,613 * 12/1992 Barker, III et al. ................... 257/713
5,323,299 * 6/1994 Weber .................................. 361/818
5,811,050 * 9/1998 Gabower .............................. 264/299
6,115,263 * 9/2000 Babineau et al. .................... 361/796

* cited by examiner

Primary Examiner—Adolf Deneke Berhane

(57) ABSTRACT

For use with an electronic equipment chassis having a module support member adapted to receive an electronic module and having a conduit containing an electrical conductor proximate the module support member, an electromagnetic interference (EMI) cover, method of manufacturing the EMI cover and electronic equipment chassis employing the same. In one embodiment, the EMI cover includes a conductive body that substantially conforms to the conduit and a boss extending from the conductive body and configured to contact a conductive case of the electronic module. The boss provides a conductive path between the conduit and the electronic module to establish a common voltage potential therebetween thereby reducing EMI emissions associated with the electronic module.

20 Claims, 3 Drawing Sheets

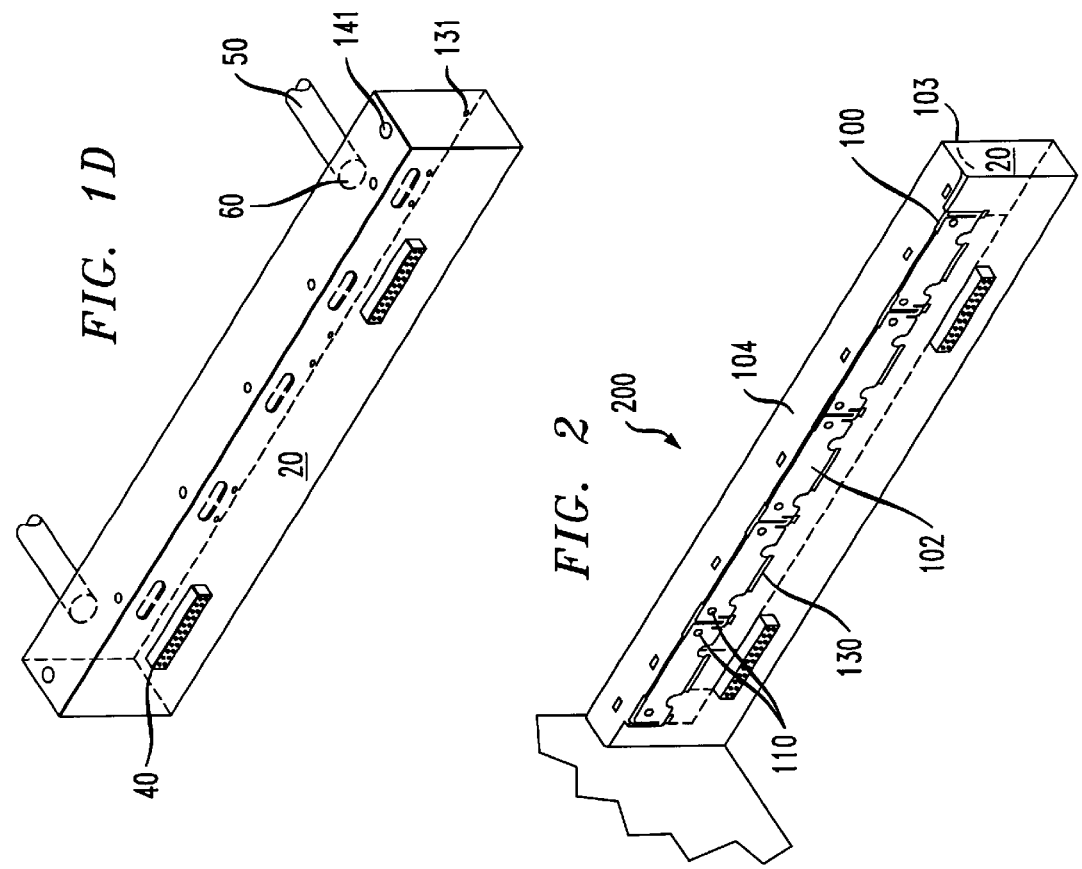
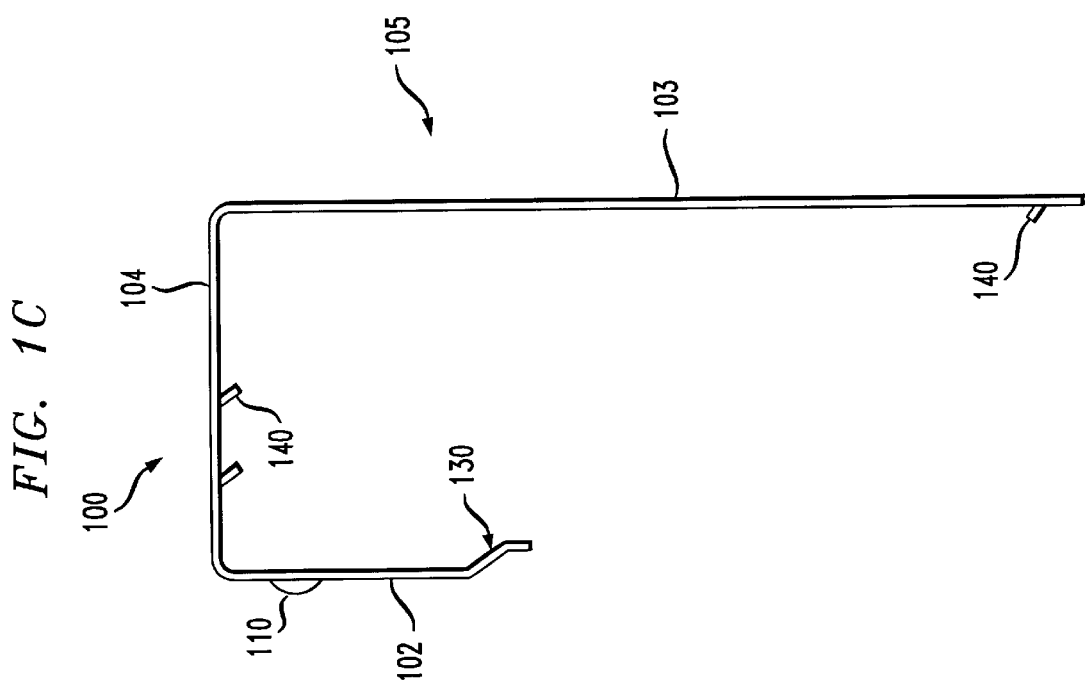

ELECTROMAGNETIC INTERFERENCE COVER FOR A CONDUIT AND AN ELECTRONIC EQUIPMENT CHASSIS EMPLOYING THE SAME

TECHNICAL FIELD OF THE INVENTION

The present invention is directed, in general, to electronic equipment and, more specifically, to an electromagnetic interference (EMI) cover for a conduit, method of manufacturing the EMI cover and an electronic equipment chassis employing the same.

BACKGROUND OF THE INVENTION

Electronic equipment in the telecommunications industry, as well as other industries, is generally designed using a modular format. The modular subassemblies that make up an electronic assembly are generally housed in a chassis including multiple racks with modular compartments.

The modular design provides several advantages including reliability, ease of maintenance and economic savings. For example, if a module in the electronic assembly malfunctions, a service technician can remove and replace the malfunctioning module without taking the system employing the module out of service. If necessary, the malfunctioning module can then be repaired at a service location by specialized technicians familiar with that type of module. This permits field maintenance to be carried out by less skilled personnel and also results in a more reliable system.

The type of chassis to accommodate the modules vary depending on the environment where the equipment is located. For instance, U.S. patent application Ser. No. 09/069,368, entitled "Modular Power Supply Chassis Employing a Suspended Bus Bar Assembly," by Byrne, et al., commonly assigned with the present invention and incorporated herein by reference, discloses an open rack assembly that accommodates modules with an exterior cabinet enclosing the electronic equipment. Regardless of the chassis type and environmental factors, the electronic assembly provides the framework to deliver electrical power to or from the modules and provides electrical connectivity between the modules.

Various electrical conductor and connector arrangements have been configured to provide electrical connectivity between modules. Such arrangements include electrical wires bundled together or separate wires running from one location to another as well as other configurations. A common method to provide electrical connectivity between modules is to route the electrical conductors through conduits of the chassis support framework housing the modules.

A concern associated with the distribution of power in the modular system is minimizing the level of electromagnetic interference (EMI) emissions radiated from the system. In the case of electrical wiring being routed through the support members of the chassis framework, generally, the conduit includes apertures to allow for routing wires in and out of the conduit and to provide the necessary connections with the various electronic modules. The apertures, however, permit EMI emissions generated by high frequency switching within power modules to escape from the conduit that, unless controlled, may exceed agency limits and impair the performance of the surrounding electronics. Typically, the EMI emissions are minimized by high frequency filtering and by using gasketing material to cover the apertures. Filtering and EMI gasketing materials, however, are expensive and not preferred solutions to such problems.

Not only can the apertures permit an unacceptable level of radiated EMI emissions, the apertures may also weaken the structure supporting the conduit. If the conduit also serves as a support member of the chassis, additional support structure may be required. Generally, providing additional structural members to a chassis is undesirable because of the increased cost, space and weight considerations.

Another consideration associated with the control of radiated EMI emissions in the modular electronic assembly is the establishment of a low impedance connection that provides a common voltage potential between the chassis and the module case (such that gaps between the chassis and the module case are ineffective antennae for radiating EMI). Although the conductive module case can be coupled to the chassis with a separate wire or by other direct contact between the chassis and the module case, these approaches exhibit characteristic impedances that are too high to be effective for controlling EMI. Even in situations where a common voltage potential is established between the module case and the chassis by direct contact, the degree of design tolerance necessary to provide a common path for the modular case to the chassis generally increases total manufacturing cost and decreases reliability.

Accordingly, what is needed in the art is a device for use with a conduit employable in an electronic equipment chassis that establishes a common voltage potential between the chassis and the case of an electronic module to reduce EMI emissions associated with the electronic module.

SUMMARY OF THE INVENTION

To address the above-discussed deficiencies of the prior art, the present invention provides for use with an electronic equipment chassis having a module support member adapted to receive an electronic module and having a conduit containing an electrical conductor proximate the module support member, an electromagnetic interference (EMI) cover, method of manufacturing the EMI cover and electronic equipment chassis employing the same. In one embodiment, the EMI cover includes a conductive body that substantially conforms to the conduit and a boss extending from the conductive body and configured to contact a conductive case of the electronic module. The boss provides a conductive path between the conduit and the electronic module to establish a common voltage potential therebetween thereby reducing EMI emissions associated with the electronic module.

The present invention, in one aspect, provides an EMI cover for a conduit that provides a conductive path between the conduit and the electronic module to ultimately reduce the EMI emissions associated therewith. The EMI cover also adds to the structural integrity of the conduit to afford additionally stiffness thereto. This is especially beneficial when the conduit has apertures located therein that permit, for instance, electrical wiring to be routed through the conduit. Under such circumstances and, in general, the EMI cover also reduces EMI emissions associated with the conduit itself.

In one embodiment of the present invention, the conductive body has a plurality of bosses. The plurality of bosses may engage a single electronic module or, alternatively, each engage a separate electronic module. When each boss engages a separate module, the bosses generally are part of separate sections of the EMI cover. Under such circumstances, it is important that the sections are electrically coupled, but mechanically independent. In a related, but alternative embodiment, the conductive body may include compression tab(s) configured to assert pressure against the conduit to further facilitate contact between the conduit and the conductive case of the electronic module(s). When the conductive body includes a plurality of compression tabs and bosses (arranged in separate sections) to engage a corresponding plurality of electronic modules, the compression tabs also facilitate mechanical independence between the separate sections of the EMI cover.

In one embodiment of the present invention, a tab is located on the conductive body configured to be received by a corresponding receptacle on the conduit. The tab facilitates alignment of the EMI cover with respect to the conduit and, also, provides an additional mechanism in conjunction with the receptacle to secure the EMI cover to the conduit. Of course, the alignment and securement tab is not necessary to practice the present invention.

In one embodiment of the present invention, the conductive body has a first edge and a second edge configured to allow the EMI cover to engage the conduit. The first and second edges, therefore, facilitate attachment of the EMI cover to a conduit of any geometry (e.g, rectangular). The advantages associated with the first and second edges will become more apparent with reference to the drawings and related description. Also, the conductive body may be formed of any conductive material such as stainless steel, brass or beryllium copper.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 1C illustrates a cross-sectional view of the EMI cover of FIG. 1B;

FIG. 1D illustrates an isometric view of the conduit of FIG. 1A adapted to receive the EMI cover of FIG. 1B;

FIG. 2 illustrates an isometric view of the EMI cover of FIG. 1B mounted on the conduit of FIG. 1D.

DETAILED DESCRIPTION

Figure 1A:
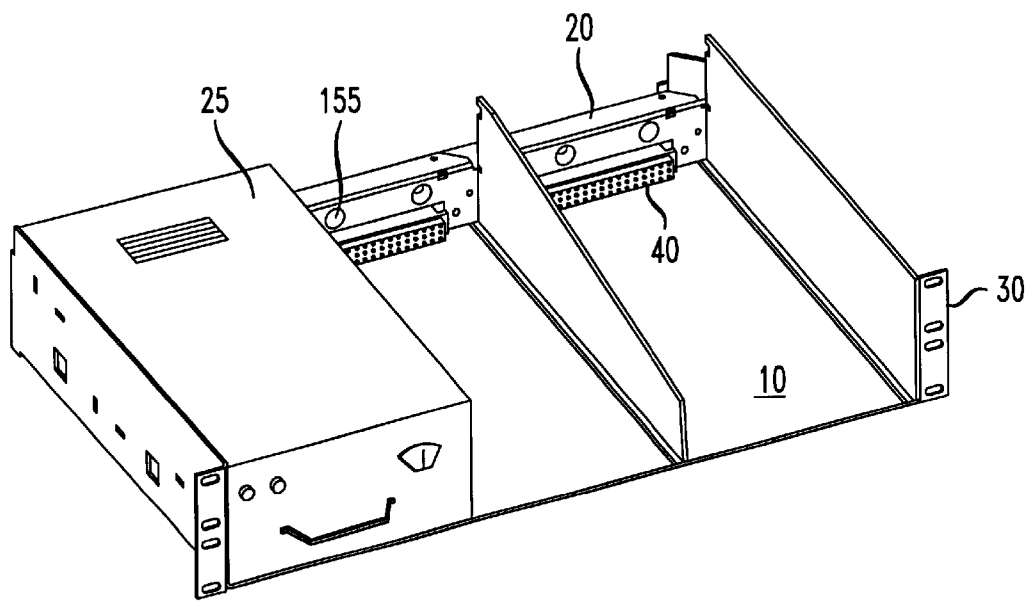
FIG. 1A illustrates an isometric view of an embodiment of module support members coupled to a conduit with an electronic module mounted thereon in accordance with the principles of the present invention.

Referring initially to FIG. 1A, illustrated is an isometric view of an embodiment of module support members (one of which is designated 10) coupled to a conduit 20 with an electronic module 25 mounted thereon in accordance with the principles of the present invention. The module support members 10 are coupled to a frame 30 of an electronic equipment chassis and the conduit 20 has an electrical conductor (see FIG. 1D) running therethrough with a connector 40 for connection to the electronic module 25. The electronic equipment chassis provides an exemplary environment for an electromagnetic interference (EMI) cover constructed according to the principles of the present invention.

Figure 1B:
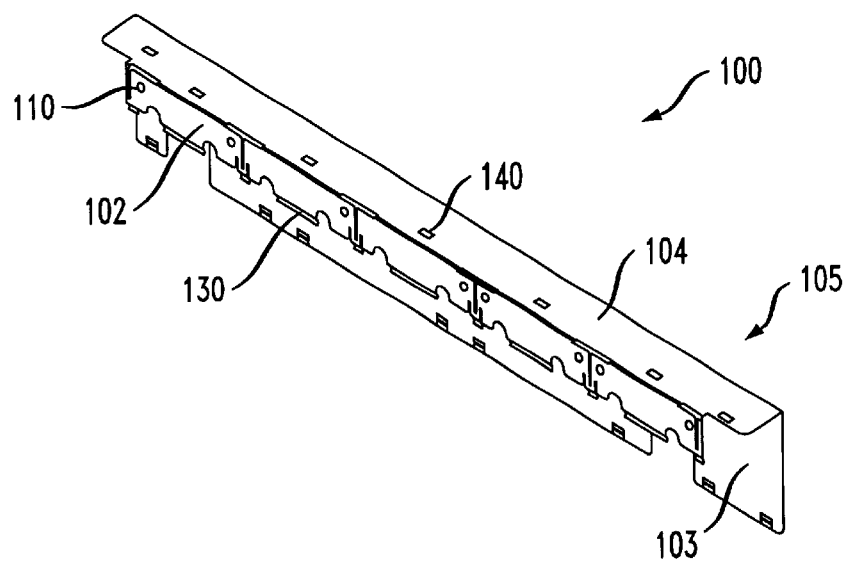
FIG. 1B illustrates an isometric view of an EMI cover constructed according to the principles of the present invention.
Figure 1E:
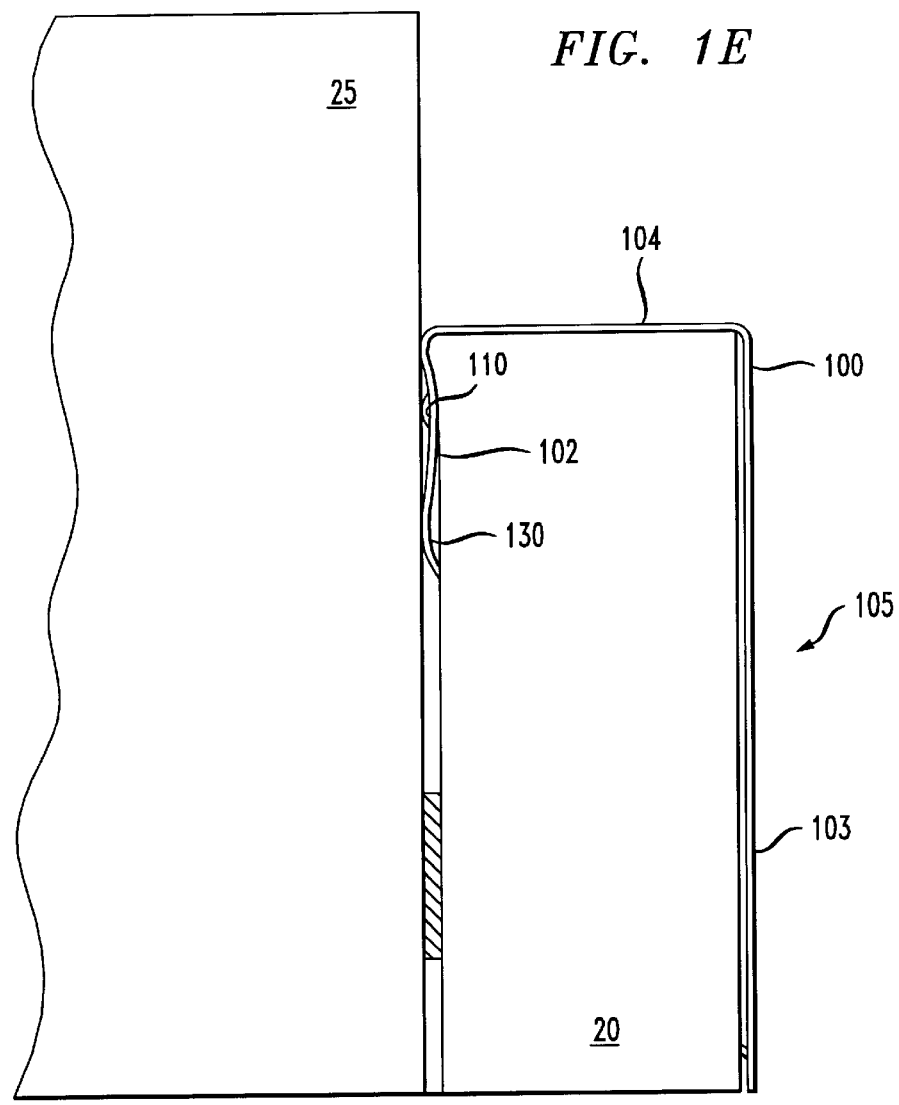
FIG. 1E illustrates a cross-sectional view of the EMI cover of FIG. 1B mounted on the conduit of FIG. 1D.

Turning now to FIGS. 1B and 1C, illustrated are isometric and cross-sectional views, respectively, of an EMI cover 100 constructed according to the principles of the present invention. Additionally, FIG. 1D illustrates an isometric view of the conduit 20 of FIG. 1A adapted to receive the EMI cover 100 of FIG. 1B, and FIGS. 1E and 2 illustrate a cross-sectional and isometric views, respectively, of the EMI cover 100 of FIG. 1B mounted on the conduit 20 of FIG. 1D. The principles of the present invention will hereinafter be described with respect to the aforementioned figures.

The EMI cover 100 includes a conductive body 105 that substantially conforms to a shape of the conduit 20. The conduit 20 is coupled to the module support member 10 and is located near the rear wall thereof. Electrical conductors (e.g., bundled wires) 50 run through the conduit 20 and provide electrical connectivity between electronic modules 25 mounted on the module support member 10.

In order to get the electrical conductors 50 into the conduit 20 (so that, for instance, power can be delivered to and between the electronic modules 25), the conduit 20 has apertures (one of which is designated 60) formed therein. The apertures 60, however, permit EMI emissions to escape and adversely impact surrounding electronic components unless controlled. When placed over the conduit 20, the EMI cover 100 substantially covers the apertures 60 and thereby reduces the EMI emissions associated therewith.

The apertures 60 in the conduit 20 also degrade the structural integrity of the conduit 20. A beneficial aspect of the EMI cover 100 is that, when placed over the conduit 20, the strength or stiffness of the conduit 20 is increased. Because stiffness is a function of the thickness to the third power, the stiffness of the conduit 20 is increased by a substantial factor. An efficient manner of providing a common voltage potential between the chassis and the conductive case of a electronic module 25 housed in the chassis is to provide a direct contact point between the chassis and the electronic module 25. Because the EMI cover 100 is made of a conductive material (e.g., stainless steel), it would be advantageous to bring the electronic module 25 in direct contact with the EMI cover 100.

The EMI cover 100 is shaped to engage the conduit 20, which has, in this particular embodiment, a rectangular cross section as illustrated in FIG. 1D. Those of ordinary skill in the art understand that the EMI cover 100 can be of any shape, depending on the shape of the conduit 20 that it is intended to cover, and still be within the broad scope of the present invention. The EMI cover 100 also includes a first or inner side panel 102 and a second or outer side panel 103 that depend from a base panel 104. The first and second side panels 102,103 that are shaped to cooperatively engage corresponding sides ofthe conduit 20, as shown in one embodiment illustrated in FIG. 2. The side panels 102,103 and the base panel 104 are preferably configured to allow the EMI cover 100 to be easily removed from the conduit 140, if so desired.

The EMI cover 100 further includes a plurality of bosses (one of which is designated 110) that extends from an outer surface of the first side panel 102, as illustrated in FIG. 1C. The bosses 110 are configured to provide direct contact with the conductive case of the electronic module 25 and provide a path to create a common voltage between the electronic module 25 and the chassis (via the conduit 20). By equalizing the voltage potential and, preferably, grounding the electronic module 25, the level of deleterious EMI emissions are reduced.

In the embodiments illustrated in FIGS. 1B–1E and FIG. 2, a pair of bosses 110 engage the electronic module 25. Of course, the EMI cover 100 may be arranged such that a single boss 110 engages the electronic module 25. The bosses 110 may be formed by various methods, which are well known to those who are skilled in the art. However, in one preferable embodiment, the bosses are stamped into an inner surface of the side panel 102 with a stamp press that protrudes a portion of the side panel 102 outwardly and in the direction toward the module 125 when it is positioned within frame 30.

In another aspect of the present invention, the first or inner side panel 102 may also include a compression tab 130. Of course, in those embodiments where a plurality of inner side panel 102 are present, each inner side panel 102 includes a compression tab 130 and at one bosses 110 configured to engage a corresponding electronic module 25. In such cases, the sections are uniquely electrically connected but still mechanically independent of each other to allow for a sure contact of the bosses 110 with modules of varying length, for example. The compression tab 130 is preferably located proximate an end of the first edge 102. The compression tab 130 facilitates contact between the bosses 10 and the conductive case of the electronic module 25. As illustrated in FIG. 1E, the compression tab 130 exerts pressure against the conduit 20 such that the bosses 110 create solid contact with the case of the electronic module 25 to establish the conductive path therebetween. Additionally, in circumstances where the EMI cover 100 includes a plurality of sections, each section includes a compression tab 130 which advances the mechanical independence between the separate sections.

The illustrated embodiment of the EMI cover 100 also includes alignment/securement tabs 140. These alignment/securement tabs 140 are preferably formed in the base 104 and located in a position so that when the EMI cover 100 is placed on the conduit 20, the alignment/securement tabs 140 cooperate with corresponding tab receptacles 141 on the conduit 20 to cover the apertures 60. Once in place, the EMI cover 100 provides stiffness to the conduit 20, and the bosses 110 are properly aligned by virtue of the cooperation between the alignment/securement tabs 140 and the tab receptacles 141 to make a grounding connection with the conductive case of a electronic module 25 when it is inserted in the module support member 10. The alignment/securement clips 140 also serve to assist in securing the EMI cover 100 to the conduit 20, while permitting its convenient removal for access to wiring routed through the conduit 20. Of course the alignment/securement clips 140 can be located on any surface or side panels 102, 103 and still be within the broad scope of the present invention.

Thus, the EMI cover 100, by way of the bosses 110, provides a conductive path between the electronic module 25 and the conduit 100 to reduce the EMI emissions associated with the electronic module 25. The EMI cover 100 provides additional benefits where, for instance, the stiffness of the conduit 20 is compromised because it has apertures 60 that permit electrical wiring to be routed through the conduit 20. In such instances, the EMI cover 100 reduces the EMI emissions associated with the conduit 100 itself.

Figure 3:
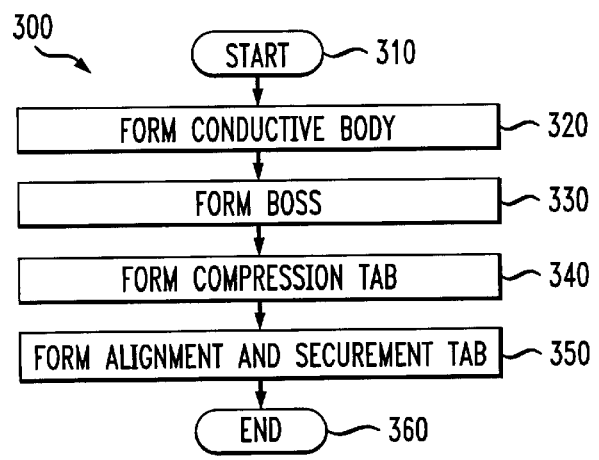
FIG. 3 illustrates an embodiment of a method of manufacturing an EMI cover in accordance with the principles of the present invention.

Turning now to FIG. 3, illustrated is one embodiment of a method of manufacturing an EMI cover in accordance with the principles of the present invention. The method commences with a start step 310. A conductive body is formed in a form conductive body step 320 so that the conductive body substantially conforms to the shape of a conduit. In a preferred embodiment, the conductive body, as well as its other components are formed by a stamp press process, which allows for a cost efficient and expeditious manner of fabrication. In step 330, a boss is formed on the first or inner side panel of the conductive body. A compression tab is formed at a proximate an end of the first side panel in step 340. Finally, a plurality of alignment and securement tabs are formed in the conductive body in step 350. The method concludes with the stop step 360. Those of ordinary skill in the art understand that additional steps can be added in order to manufacture additional embodiments of the present invention and still be within the scope of the invention.

The foregoing has outlined, rather broadly, preferred and alternative features of the present invention so that those skilled in the art may better understand the detailed description of the invention that follows. Those skilled in the art should appreciate that they can readily use the disclosed conception and specific embodiments as a basis for designing or modifying other structures for carrying out the same purposes of the present invention. Those skilled in the art should also realize that such equivalent constructions do not depart from the spirit and scope of the invention in its broadest form.

What is claimed is:

1. For use with an electronic equipment chassis having a module support member adapted to receive an electronic module and having a conduit containing an electrical conductor proximate said module support member, an electromagnetic interference (EMI) cover, comprising:

a conductive body having a base panel and first and second opposing side panels that depend in a same direction from said base panel and that substantially conforms to said conduit; and a boss extending from said first opposing side panel and configured to contact a conductive case of said electronic module, said boss providing a conductive path between said conduit and said electronic module to establish a common voltage potential therebetween thereby reducing EMI emissions associated with said electronic module.

2. The EMI cover as recited in claim 1 wherein said conductive body has a plurality of bosses.

3. The EMI cover as recited in claim 1 wherein a tab is located on said conductive body configured to be received by a corresponding receptacle on said conduit.

4. The EMI cover as recited in claim 1 wherein said conductive body is stainless steel.

5. The EMI cover as recited in claim 1 wherein said conductive body has a first edge and a second edge configured to allow said EMI cover to engage said conduit.

6. The EMI cover as recited in claim 1 further comprising a compression tab depending from an end of said first panel and configured to assert pressure against said conduit to further facilitate contact between said conduit and said conductive case of said electronic module.

7. The EMI cover as recited in claim 1 wherein said conduit has a rectangular cross section.

8. An electronic equipment chassis having a frame, comprising:

a conduit including an electrical conductor and coupled to said frame;

a module support member couplable to said conduit and configured to receive an electronic module therein; and an electromagnetic interference (EMI) cover, including:

a conductive body having a base panel and first and second opposing side panels that depend in a same direction from said base panel and that substantially conforms to said conduit; and a boss extending from said first opposing side panel and configured to contact a conductive case of said electronic module when said electronic module is position within said module support member, said boss providing a conductive path between said conduit and said electronic module to establish a common voltage potential therebetween thereby reducing EMI emissions associated with said electronic module.

9. The electronic equipment chassis as recited in claim 8 wherein said conductive body has a plurality of bosses.

10. The electronic equipment chassis as recited in claim 8 wherein an alignment/securing tab located on said base panel and configured to cooperatively engage a corresponding receptacle on said conduit.

11. An electronic equipment chassis as recited in claim 8 wherein said conductive body is stainless steel.

12. An electronic equipment chassis as recited in claim 8 wherein said EMI cover includes a compression tab located proximate an end of said first side panel.

13. An electronic equipment chassis as recited in claim 12 wherein said compression is configured to assert pressure against said conduit to further facilitate contact between said conduit and said conductive case.

14. An electronic equipment chassis as recited in claim 8 wherein said conduit has a rectangular cross section.

15. For use with an electronic equipment chassis having a module support member adapted to receive an electronic module and having a conduit containing an electrical conductor proximate said module support member, a method of manufacturing an electromagnetic interference (EMI) cover, comprising:

forming a conductive body having a base panel and first and second opposing side panels that depend in a same direction from said base panel and that substantially conforms to said conduit; and forming a boss extending from said first opposing side panel and configured to contact a conductive case of said electronic module, said boss providing a conductive path between said conduit and said electronic module to establish a common voltage potential therebetween thereby reducing EMI emissions associated with said electronic module is positioned within said module support member.

16. The method of manufacturing as recited in claim 15 further comprising forming a plurality of bosses extending from said first side panel.

17. The method of manufacturing as recited in claim 15 further comprising forming an alignment/securing tab on said base panel configured to cooperatively engage a corresponding receptacle on said conduit.

18. The method of manufacturing as recited in claim 15 wherein said conductive body is formed of stainless steel.

19. The method of manufacturing as recited in claim 15 further comprising forming a compression tab approximate an end of said first side panel configured to assert pressure against said conduit to further facilitate contact between said conduit and said conductive case of said electronic module.

20. The method of manufacturing as recited in claim 15 wherein said conduit has a rectangular cross section.

* * * * *